United States Patent
Fujikake et al.

[11] Patent Number: 5,482,586
[45] Date of Patent: Jan. 9, 1996

[54] METHOD OF MANUFACTURING MULTILAYER PRINTED WIRING BOARD

[75] Inventors: Katsuhiko Fujikake; Hidetaka Miyama, both of Sayama, Japan

[73] Assignee: Fanuc Ltd., Yamanishi, Japan

[21] Appl. No.: 143,388

[22] Filed: Oct. 29, 1993

Related U.S. Application Data

[63] Continuation of Ser. No. 933,911, Aug. 27, 1992, abandoned, which is a continuation of Ser. No. 582,205, filed as PCT/JP90/00132, Feb. 1, 1990 abandoned.

[30] Foreign Application Priority Data

Feb. 23, 1989 [JP] Japan ......................... 1-44222

[51] Int. Cl.$^6$ ..................................... B32B 31/20
[52] U.S. Cl. .................. 156/233; 156/249; 156/307.7
[58] Field of Search ........................... 428/601, 626, 428/654, 645, 674, 675, 676, 636, 652; 156/307.7, 306.9, 233, 901, 249

[56] References Cited

U.S. PATENT DOCUMENTS

| | | | |
|---|---|---|---|
| 4,323,632 | 4/1982 | Bendan et al. | 428/674 |
| 4,431,710 | 2/1984 | Lifshin et al. | 428/632 |
| 4,568,413 | 2/1986 | Toth et al. | 156/131 |
| 4,781,969 | 11/1988 | Kobayashi et al. | 428/209 |
| 4,875,283 | 10/1989 | Johnston | 29/830 |

FOREIGN PATENT DOCUMENTS

| | | | |
|---|---|---|---|
| 56-078199 | 6/1981 | Japan | 428/601 |
| 58-30195 | 2/1983 | Japan | |
| 60-206088 | 10/1985 | Japan | |
| 61-277428 | 12/1986 | Japan | |
| 62-232997 | 10/1987 | Japan | |

*Primary Examiner*—John Zimmerman
*Assistant Examiner*—Linda L. Gray
*Attorney, Agent, or Firm*—Staas & Halsey

[57] ABSTRACT

Two aluminum-copper foils, each composed of a layer of copper and a layer of aluminum, are held back to back with the aluminum surfaces against each other, thereby providing an outer layer material (20) for a multilayer printing wiring board. To manufacture a multilayer printed wiring board, an outer layer material (20), a prepreg (2), an inner layer laminate (1), a prepreg (3), and an outer layer material (21) are successively stacked or built up in the order named. The aluminum surface of the outer layer material (20) replaces the mirror finished steel plate and dummy plate which have heretofore been employed. Since the aluminum surfaces can easily be separated from each other, they perform the function of conventional parting films. As the aluminum surfaces of the outer layer material (20) are held in intimate contact with each other, resin refuse or foreign matter does not become attached to the aluminum surfaces, and the aluminum surfaces are prevented from being scratched or dented or otherwise made defective. Since mirror finished steel surfaces are not employed, the manufacturing process is simplified, and the buildup operation can be automated. The aluminum foils may be replaced with foils of a plastic metal such as an aluminum alloy, copper, brass, soft iron, a lead alloy, or the like.

2 Claims, 3 Drawing Sheets

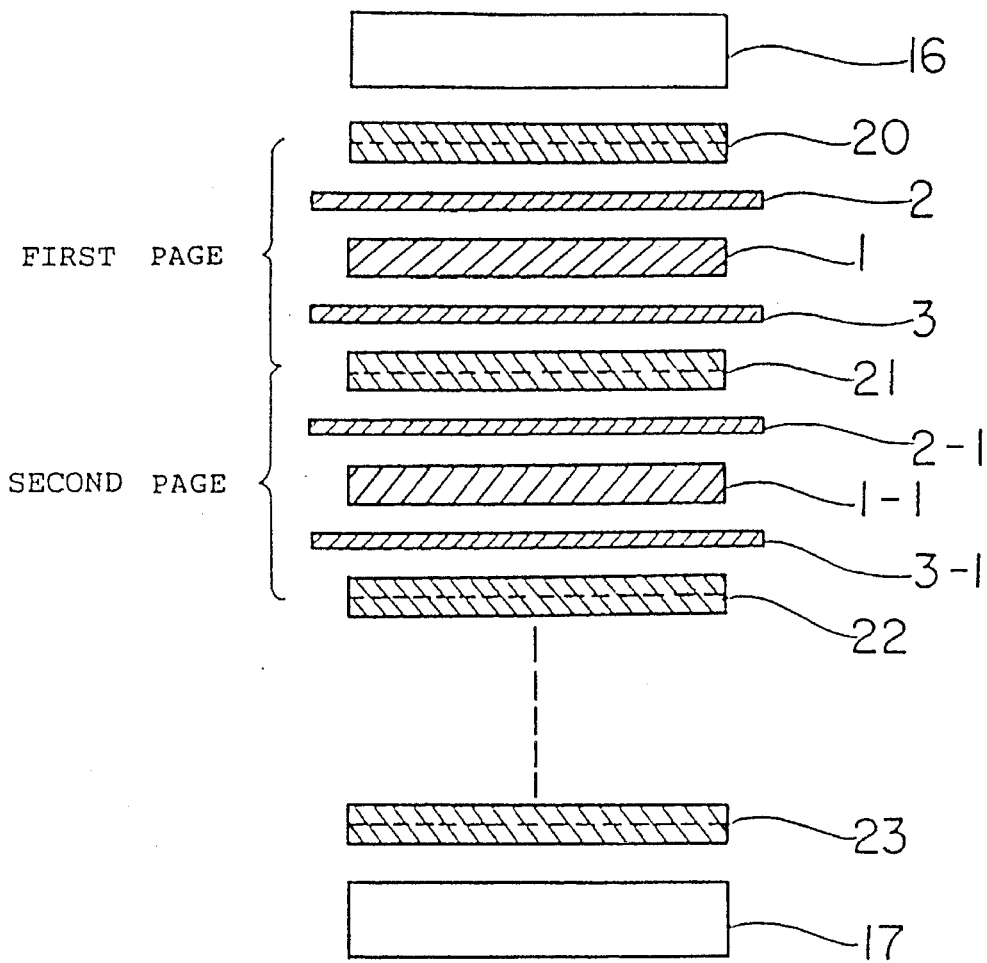
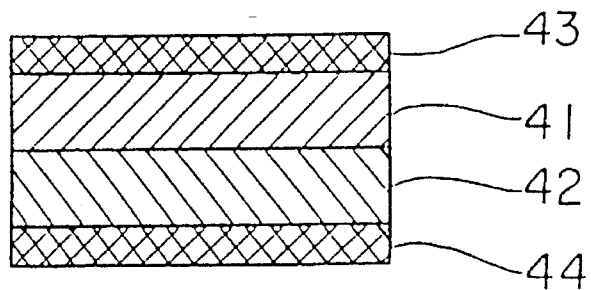

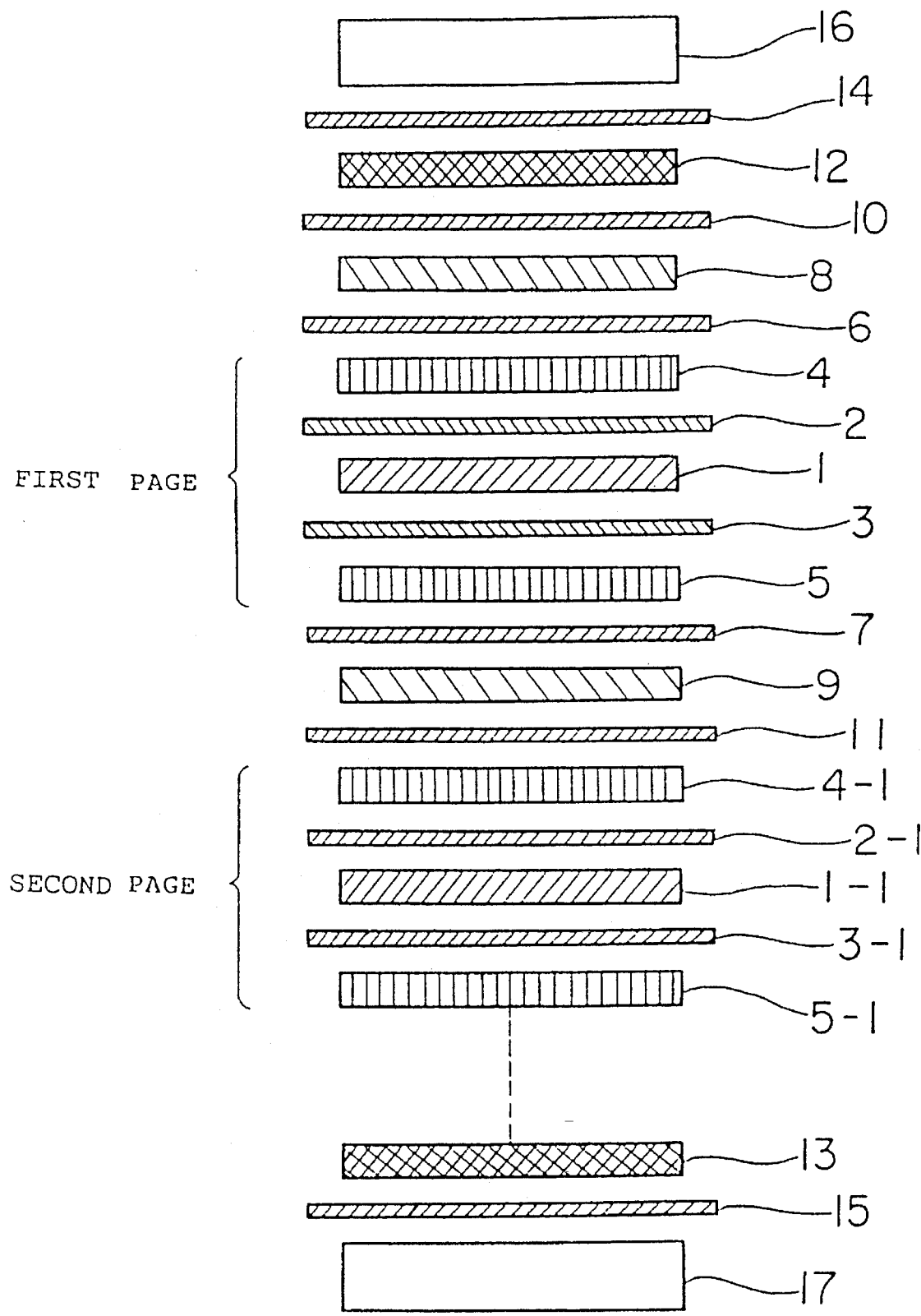

METHOD OF MANUFACTURING MULTILAYER PRINTED WIRING BOARD

This application is a continuation of application Ser. No. 07/933,911, filed Aug. 27, 1992, now abandoned, which is a continuation of application Ser. No. 07/582,205, filed as PCT/JP90/00132, Feb. 1, 1990, now abandoned.

TECHNICAL FIELD

The present invention relates to a laminating material of outer layer for a multilayer printed wiring board, and a method of manufacturing such a multilayer printed wiring board.

BACKGROUND ART

The tendency of modern electronic devices is toward a smaller size, a lower profile, and more functions, and hence various components such as various IC units used in such electronic devices are required to be smaller in size, lower in profile, and have more functions. In view of the tendency, it is desired that printed wiring boards on which the electronic components are to be mounted be smaller in size and higher in density. One approach to the requirement is to use a multilayer printed wiring board which has wiring patterns in a multiple of layers.

FIG. 5 shows a conventional method of manufacturing a multilayer printed wiring board. The conventional method of manufacturing a multilayer printed wiring board will hereinafter be described with reference to FIG. 5. First, prepregs 2, 3 are placed on the respective upper and lower opposite sides of a dielectric laminate (inner layer laminate) 1 which has conductive wiring patterns (not shown) on both of its both surfaces. Then, an outer layer material 4 composed of a copper foil is placed on the upper side of the prepreg 2, and an outer layer material 5 is placed on the lower side of the prepreg 3. The inner layer 1, the prepregs 2, 3, and the outer layers 4, 5 jointly form a multilayer (four-layer) printed wiring board as a first page. A multilayer printed wiring board as a second page, which is the same construction as that of the first page printed wiring board is positioned below the first page printed wiring board. Between the first and second pages, there are disposed parting films 7, 11 and a mirror finished steel plate 9 sandwiched therebetween. The multilayer printed wiring boards which are separated by the mirror finished steel plate are stacked ranging from 5 to 12 pages, and then are sandwiched by bonding dies 16, 17 with dummy plates 12, 13 and parting films 14, 15 interposed therebetween. The multilayer printed board stacks are then inserted between hot press plates, and pressed to laminate with heat.

In order to position the circuits on the inner layers into registry, both stacked laminates have punched through holes in the same positions, and are fixed in position by positioning pins extending through the through holes.

The above prior art is disclosed in Japanese Laid-Open Patent Publications Nos. 60-62193 and 60-65598.

The mirror finished steel plates serve to reduce thickness irregularities and minimize surface irregularities due to projecting conductive wiring patterns on the surfaces of the inner layers of the laminated multilayer printed wiring boards, and uniformize the temperature distribution in the direction in which the printed wiring boards are stacked. Therefore, the mirror finished steel plates are indispensable when the multilayer printed wiring boards are laminating with the conventional method.

The parting films are employed to prevent both the multilayer printed wiring boards and the mirror finished steel plates from being bonded due to a flow of interlayer adhesive (prepregs) while the stacks are being pressed to laminate with heat by the press plates.

The dummy plates are used to improve the temperature distribution in the direction in which the printed wiring boards are stacked, while they are being heated by the press plates.

With the conventional method, the mirror finished steel plates have to be thoroughly cleansed each time a heating and pressing cycle is finished, so that powdery foreign matter and resin refuse from the prepregs will not remain attached to the mirror finished steel plates, and the mirror finished steel plates thus cleaned are repeatedly used.

However, when the multilayer printed wiring boards are stacked after the mirror finished steel plates are cleansed, the outer layer materials (copper foils) are liable to be scratched or dented when they are pressed because powdery foreign matter and resin refuse from the prepregs are apt to be attached to the mirror finished steel plates, or due to surface irregularities of the mirror finished steel plates. If this happens, the wiring patterns on the multilayer printed wiring boards become defective.

According to the conventional buildup method, the parting films must be superposed on the upper and lower surfaces of each of the mirror finished steel plates. This procedure is however inefficient and complex, resulting in obstacles to product quality stability, cost reductions, and process automation. Specifically, since there are many steps involved in stacking the multilayer printed wiring boards, it is difficult to automate the process using robots.

DISCLOSURE OF THE INVENTION

The present invention has been made in view of the aforesaid drawbacks. It is an object of the present invention to provide an outer layer material for a multilayer printed wiring board and a method of manufacturing such a multilayer printed wiring board, with a stacking process which is simple and free of causes of defects.

To achieve the above object, there is provided in accordance with the present invention an outer layer material for a multilayer printed wiring board, comprising first and second plastic-metal-copper foils each composed of copper and a plastic metal such as an aluminum alloy, copper, brass, soft iron, a lead alloy, or the like, whose first and second plastic-metal foil sides are integrally joined together, but are easily separable from each other after lamination.

There is also provided a method of manufacturing a multilayer printed wiring board, comprising the steps of: stacking a first outer layer material of the above construction, a first prepreg, an inner layer laminate having wiring patterns on both surfaces thereof, a second prepreg, and a second outer layer material of the above construction, in the order named, thereby producing a stacked assembly.

Two plastic-metal-copper foils each composed of copper and aluminum are held back to back, with plastic-metal surfaces against each other, thereby providing an outer layer material for a multilayer printed wiring board. To manufacture a multilayer printed wiring board, an outer layer material, a prepreg, an inner layer laminate, a prepreg, and an outer layer are successively stacked or built up in the order named. The plastic-metal surface of the outer layer material serves as a mirror finished steel plate and a dummy plate which have heretofore been employed. Since the aluminum surfaces can easily be separated from each other, they perform the function of conventional parting films.

As the aluminum surfaces of the outer layer materials are held in intimate contact with each other, resin refuse or foreign matter are not attached to the aluminum surfaces, and the aluminum surfaces are prevented from being scratched or dented or otherwise made defective. Since no mirror finished steel plates are employed, the manufacturing process is simplified, and the build-up operation can be automatized.

BRIEF DESCRIPTION OF THE DRAWINGS

FIG. 1 is a view showing an embodiment of a method of manufacturing a multilayer printed wiring board according to the present invention;

FIG. 2 is a view showing the structure of an outer layer material used in the method of manufacturing a multilayer printed wiring board according to the present invention;

FIG. 5 is a view illustrating a conventional method of manufacturing multilayer printed wiring boards.

BEST MODE FOR CARRYING OUT THE INVENTION

Figure 4:
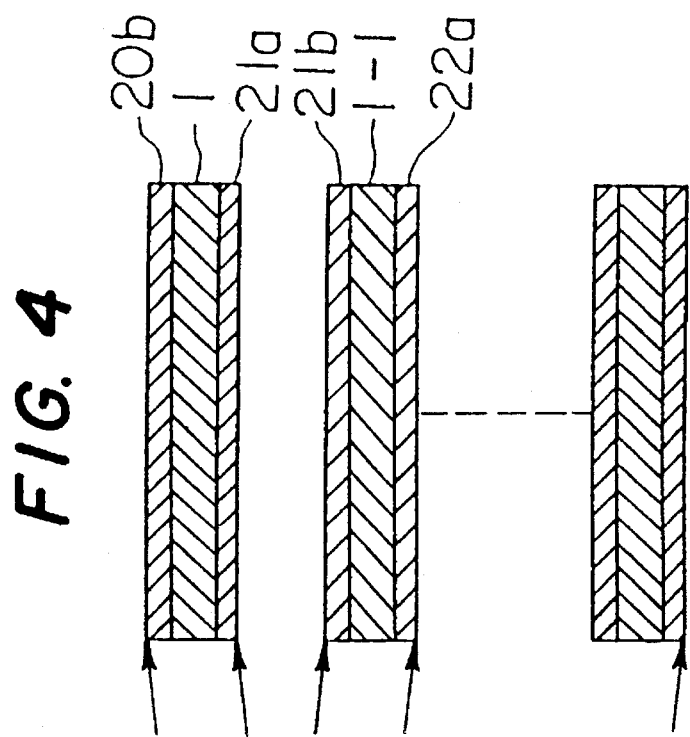
FIG. 4 is a view showing the multilayer printed wiring boards which are separated from the stacks.

An embodiment of the present invention will hereinafter be described with reference to the drawings.

FIG. 2 shows the structure of an outer layer material used in a method of manufacturing a multilayer printed wiring board according to the present invention. The outer layer material comprises a first aluminum-copper foil which is composed of a copper foil 43 attached under pressure or plated on one surface of an aluminum foil 41, and a second aluminum-copper foil which is composed of a copper foil 44 deposited similarly on one surface of an aluminum foil 42. The aluminum foil 41 has a thickness of about 70 μm, and the copper foil 43 has a thickness of about 18 μm. The first and second aluminum-copper foils are bonded, with their aluminum surfaces held against each other, into an integral structure by a plastic-base adhesive whose bonding strength weakens at a temperature of about 170 degrees. The aluminum surfaces can therefore be separated with ease after lamination. Even if the aluminum surfaces are joined under pressure and heat, their bonding strength may weaken at a certain temperature as with the adhesive. Alternatively, the first and second aluminum surfaces may be joined to each other by spot-welding at two or more locations on their peripheral edges. In this case, the first and second aluminum surfaces can be separated from each other when the welded regions are subsequently removed.

Treated copper surfaces of the outer layer thus prepared may be coated with a resin such as an epoxy, a polyimide, or a blend thereof, for making a printed wiring board. The thickness of the aluminum foil should preferably range from about 30 to 100 μm, and the thickness of the copper foil should preferably range from about 5 to 35 μm.

The aluminum foil may be replaced with a foil of plastic metal such as an aluminum alloy, copper, brass, soft iron, a lead alloy, or the like.

A method of manufacturing a multilayer printed wiring board using the outer layer material shown in FIG. 2 will be described below. FIG. 1 shows an embodiment of a method of manufacturing a multilayer printed wiring board according to the present invention. The method shown in FIG. 1 is a buildup manufacturing method. First, prepregs 2, 3 are placed on the respective upper and lower opposite sides of an inner layer laminate 1 which has conductive wiring patterns (not shown) on both of its surfaces. Then, an outer layer material 20 of the structure shown in FIG. 2 is placed on the upper side of the prepreg 2, and an outer layer material 21 of the structure shown in FIG. 2 is placed on the lower side of the prepreg 3. The inner layer laminates 1, the prepregs 2, 3, a lower half of the outer layer material 20 (i.e., the second aluminum-copper foil composed of the aluminum foil 42 and the copper foil 44), and an upper half of the outer layer material 21 (i.e., the first aluminum-copper foil composed of the aluminum foil 41 and the copper foil 43) jointly are used to fabricate a multilayer (four-layer) printed wiring board as a first page. A multilayer printed wiring board as a second page, which is the same construction as that of the first page printed wiring board, with a lower half of the outer layer material 21 being used as an outer layer, is positioned below the first page printed wiring board. The multilayer printed wiring boards which are parted by the outer layer materials shown in FIG. 2 are provided in stacks ranging from 1 to 24 pages, and then are sandwiched directly by bonding dies 16, 17. The multilayer printed wiring board stacks are then inserted between hot press plates, and pressed to laminate with heat.

In this embodiment, the multilayer printed wiring boards are fabricated without the need for parting films, dummy plates, and mirror finished steel plates which have heretofore been employed. Since only one unit of outer layer material 21 is required to be placed between the first and second pages, the process is simplified.

Figure 3:
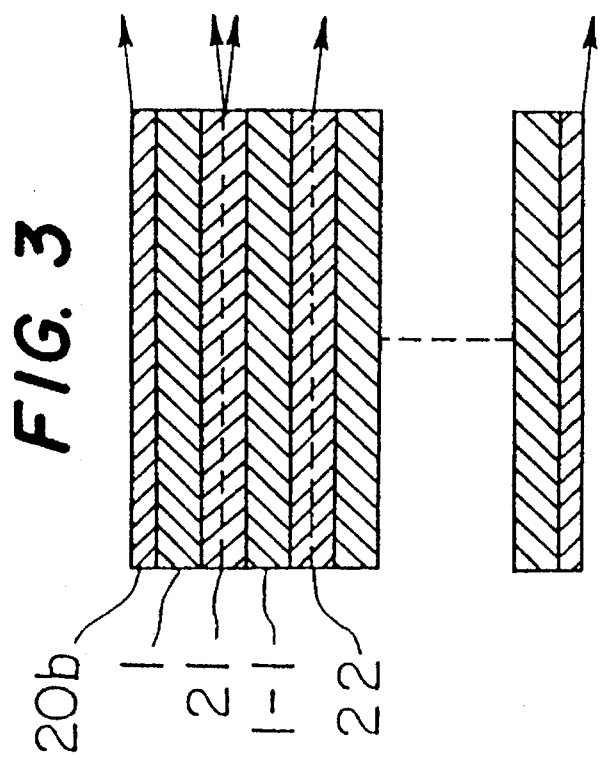
FIG. 3 is a view showing the laminated stacks of multilayer printed wiring boards which are taken from hot press plates after finishing the press cycle.

FIG. 3 shows the stacked multilayer printed wiring boards which are removed from between the hot press plates after they are laminated with heat. The inner layers and the outer layers are firmly bonded by prepregs (not shown) when pressed with heat. The stacked multilayer printed wiring boards which are taken out from between the hot press plates are then separated along the joined aluminum surfaces of the outer layers 21, 22 into individual multilayer printed wiring boards as shown in FIG. 4.

A separated multilayer printed wiring board has outer layers 20b, 21a on the opposite sides of the inner layer 1, the outer layers 20b, 21a having aluminum surfaces, respectively. These aluminum surfaces are used to allow a drill bit to easily enter into the laminates when holes are drilled in the multilayer printed wiring board. After the drilling process, the aluminum foils are peeled off.

With the embodiment as described above, the dummy plates, parting films, and mirror finished steel plates, which have heretofore been employed, are no longer necessary, and the entire laminating process is simplified. The process of attaching aluminum onto the surface of laminates for drilling is eliminated. Since the stacked multilayer printed wiring boards are separated along the joined aluminum surfaces of the outer layers after the laminating process, the separated aluminum surfaces are free from foreign matter and hence clean, and do not need to be polished prior to the photo-imaging of the outer layer circuit.

In the above embodiment, the manufacture of a four-layer printed wiring board is described. However, the present invention is also applicable to the manufacture of a multiple printed wiring board of six or more layers.

with the present invention, as described above, the cost of manufacture can be reduced, the process can be automatized, and the product quality can be improved in the process of laminating multilayer printed wiring boards.

We claim:

1. A method for manufacturing a multilayer heat and pressure laminated printed circuit board assemblage comprising the steps of:

providing an outer layer composite comprising a first outer layer structure and a second outer layer structure, said first and second outer layer structures each comprising (1) a copper foil outer layer having inside and outside surfaces and which is suitable for further processing to form an outer wiring pattern for said multilayer heat and pressure laminated printed circuit board assemblage and (2) a protective plastic metal layer having front and back surfaces, the copper foil outer layer and the protective plastic metal layer of each of said first and second outer layer structures being joined together with the front surface of the protective plastic metal layer attached to the outside surface of the copper foil outer layer so as to protect said outside surface, the back surfaces of the protective plastic metal layers of the structures of the composite being separably joined together to present said composite, said back surfaces of said protective plastic metal layers of said outer layer composite being joined together in such a manner as to allow separation thereof after the outer layer composite has been used in preparing a said multilayer heat and pressure laminated printed circuit board assemblage to thereby present two separated outer layer structures wherein the outside surface of the outer layer of each said separated outer layer structure continues to be protected by a respective protective plastic metal layer;

providing a pair of prepregs and a pair of inner layer laminates, each said inner layer laminate having a wiring pattern on a surface thereof;

stacking said outer layer composite, said prepregs and said inner layer laminates in such a way that the stack comprises a first inner layer laminate at the bottom with its wiring pattern facing upwardly, a first prepreg on top of the wiring pattern of the first inner layer laminate, said outer layer composite on top of said first prepreg with the inside surface of one of its copper foil outer layers facing upwardly and with the inside surface of the other of its copper foil outer layers facing downwardly, a second prepreg on top of said outer layer composite, and a second inner layer laminate with its wiring pattern facing downwardly on top of said second prepreg;

pressing and heating said stack under laminating conditions to thereby bond the inside surfaces of the copper foil outer layers and the wiring patterns of the inner layer laminates to an adjacent prepreg; and thereafter separating the separably joined back surfaces of the protective plastic metal layers of the stack to thereby present a pair of multilayer heat and pressure laminated printed circuit board assemblages, each having a protected copper foil layer attached to a side thereof.

2. A method for manufacturing a multilayer heat and pressure laminated printed circuit board assemblage comprising the steps of:

providing a plurality of outer layer composites, each said composite comprising a first outer layer structure and second outer layer structure, said first and second outer layer structures each comprising (1) a copper foil outer layer having inside and outside surfaces and which is suitable for further processing to form an outer wiring pattern for said multilayer heat and pressure laminated printed circuit board assemblage and (2) a protective plastic metal layer having front and back surfaces, the copper foil outer layer and the protective plastic metal layer of each of said first and second outer layer structures being joined together with the front surface of the protective plastic metal layer attached to the outside surface of the copper foil outer layer so as to protect said outside surface, the back surfaces of the protective plastic metal layers of the respective structures of each said outer layer composite being separably joined together to present the corresponding composite, said back surfaces of said protective plastic metal layers of each said outer layer composite being joined together in such a manner as to allow separation thereof after the outer layer composites have been used in preparing a said multilayer heat and pressure laminated printed circuit board assemblage to thereby present two separated outer layer structures wherein the outside surface of the outer layer of each said separated outer layer structure continues to be protected by a respective protective plastic metal layer;

providing a plurality of prepregs and a plurality of inner layer laminates, each said inner layer laminate having a wiring pattern on a surface thereof, and at least one of said laminates having a wiring pattern on both sides thereof;

stacking said outer layer composites, said prepregs and said inner layer laminates in such a way that the stack comprises a first inner layer laminate at the bottom with its wiring pattern facing upwardly, a first prepreg on top of the wiring pattern of the first inner layer laminate, a first outer layer composite on top of said first prepreg with the inside surface of one of its copper foil outer layers facing upwardly and with the inside surface of the other of its copper foil outer layers facing downwardly, a second prepreg on top of said first outer layer composite, said one of said inner layer laminates on top of said second prepreg, a third prepreg on top of said one of said inner layer laminates, a second outer layer composite on top of said third prepreg with the inside surface of one of its copper foil outer layers facing upwardly and with the inside surface of the other of its copper foil outer layers facing downwardly, and a second inner layer laminate at the top with its wiring pattern facing downwardly;

pressing and heating said stack under laminating conditions to thereby bond the inside surfaces of the copper foil outer layers and the wiring patterns of the inner layer laminates to an adjacent prepreg; and thereafter separating the separably joined back surfaces of the protective plastic metal layers of the stacks to thereby present a plurality of multilayer heat and pressure laminated printed circuit board assemblages, each having a protected copper foil outer layer attached to at least one side thereof.

* * * * *

UNITED STATES PATENT AND TRADEMARK OFFICE
CERTIFICATE OF CORRECTION

PATENT NO. : 5,482,586
DATED : January 9, 1996
INVENTOR(S) : KATSUHIKO FUJIKAKE et al.

It is certified that error appears in the above-indentified patent and that said Letters Patent is hereby corrected as shown below:

Column 5, line 1, delete "with" and substitute --With--;

Signed and Sealed this

Fourth Day of June, 1996

Attest:

BRUCE LEHMAN

*Attesting Officer*     *Commissioner of Patents and Trademarks*